US012787393B2

(12) United States Patent
Kushibe et al.

(10) Patent No.: US 12,787,393 B2
(45) Date of Patent: Nov. 3, 2026

(54) WAFER AND METHOD FOR MANUFACTURING THE SAME

(71) Applicant: KABUSHIKI KAISHA TOSHIBA, Tokyo (JP)

(72) Inventors: Mitsuhiro Kushibe, Setagaya Tokyo (JP); Ryosuke Iijima, Setagaya Tokyo (JP); Johji Nishio, Machida Tokyo (JP); Chiharu Ota, Kawasaki Kanagawa (JP); Tatsuo Shimizu, Shinagawa Tokyo (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 361 days.

(21) Appl. No.: 18/581,445

(22) Filed: Feb. 20, 2024

(65) Prior Publication Data

US 2025/0089322 A1 Mar. 13, 2025

(30) Foreign Application Priority Data

Sep. 11, 2023 (JP) ................................ 2023-147110

(51) Int. Cl.
*H10D 62/832* (2025.01)
*H10P 14/20* (2026.01)
*H10P 14/24* (2026.01)

(52) U.S. Cl.
CPC ......... *H10D 62/8325* (2025.01); *H10P 14/24* (2026.01); *H10P 14/2904* (2026.01); *H10P 14/3408* (2026.01); *H10P 14/3458* (2026.01)

(58) Field of Classification Search
CPC .. H10D 62/8325; H10P 14/24; H10P 14/2904
See application file for complete search history.

(56) References Cited

U.S. PATENT DOCUMENTS

2015/0004738 A1* 1/2015 Fujii .................... H10F 39/026 438/64
2023/0066135 A1 3/2023 Yoshie

FOREIGN PATENT DOCUMENTS

DE 112014005116 T5 * 9/2016 ............. H10P 95/90
JP 5014737 B2 8/2012

OTHER PUBLICATIONS

Shunta Harada et al., "Solvent Design for High-Purity SiC Solution Growth," Material Science Forum, vol. 897, pp. 32-35 (2017).
Japan Patent Office, Office Action in JP App. No. 2023-147110 (Jan. 30, 2026).

* cited by examiner

*Primary Examiner* — Errol V Fernandes
(74) *Attorney, Agent, or Firm* — Finnegan, Henderson, Farabow, Garrett & Dunner, LLP

(57) ABSTRACT

According to one embodiment, a wafer includes a substrate including SiC, and a first layer including SiC. The first layer is in contact with the substrate. The first layer includes Cr. The substrate does not include Cr. Or a concentration of Cr in the substrate is lower than a concentration of Cr in the first layer. A substrate length of the substrate in a second direction crossing a first direction from the substrate to the first layer is longer than a first layer length of the first layer in the second direction.

15 Claims, 7 Drawing Sheets

WAFER AND METHOD FOR MANUFACTURING THE SAME

CROSS-REFERENCE TO RELATED APPLICATIONS

This application is based upon and claims the benefit of priority from Japanese Patent Application No. 2023-147110, filed on Sep. 11, 2023; the entire contents of which are incorporated herein by reference.

FIELD

Embodiments described herein relate generally to a wafer and a method for manufacturing the same.

BACKGROUND

For example, semiconductor devices and the like are manufactured using SiC wafers. Stable characteristics are desired for wafers and semiconductor devices.

DETAILED DESCRIPTION

Figure 1:
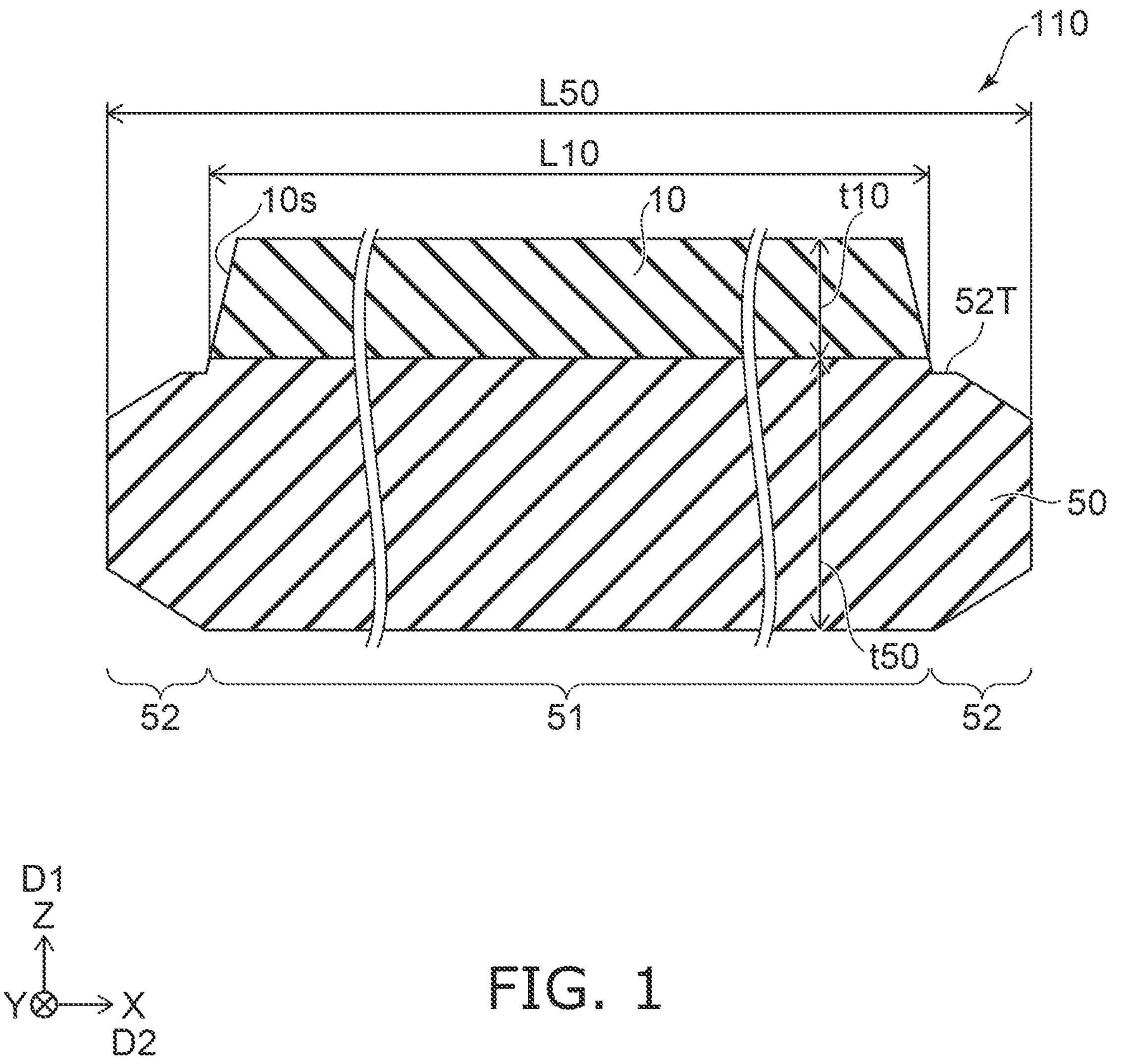
FIG. 1 is a schematic cross-sectional view illustrating a wafer according to a first embodiment.

According to one embodiment, a wafer includes a substrate including SiC, and a first layer including SiC. The first layer is in contact with the substrate. The first layer includes Cr. The substrate does not include Cr. Or a concentration of Cr in the substrate is lower than a concentration of Cr in the first layer. A substrate length of the substrate in a second direction crossing a first direction from the substrate to the first layer is longer than a first layer length of the first layer in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a wafer according to the first embodiment.

Figure 2:
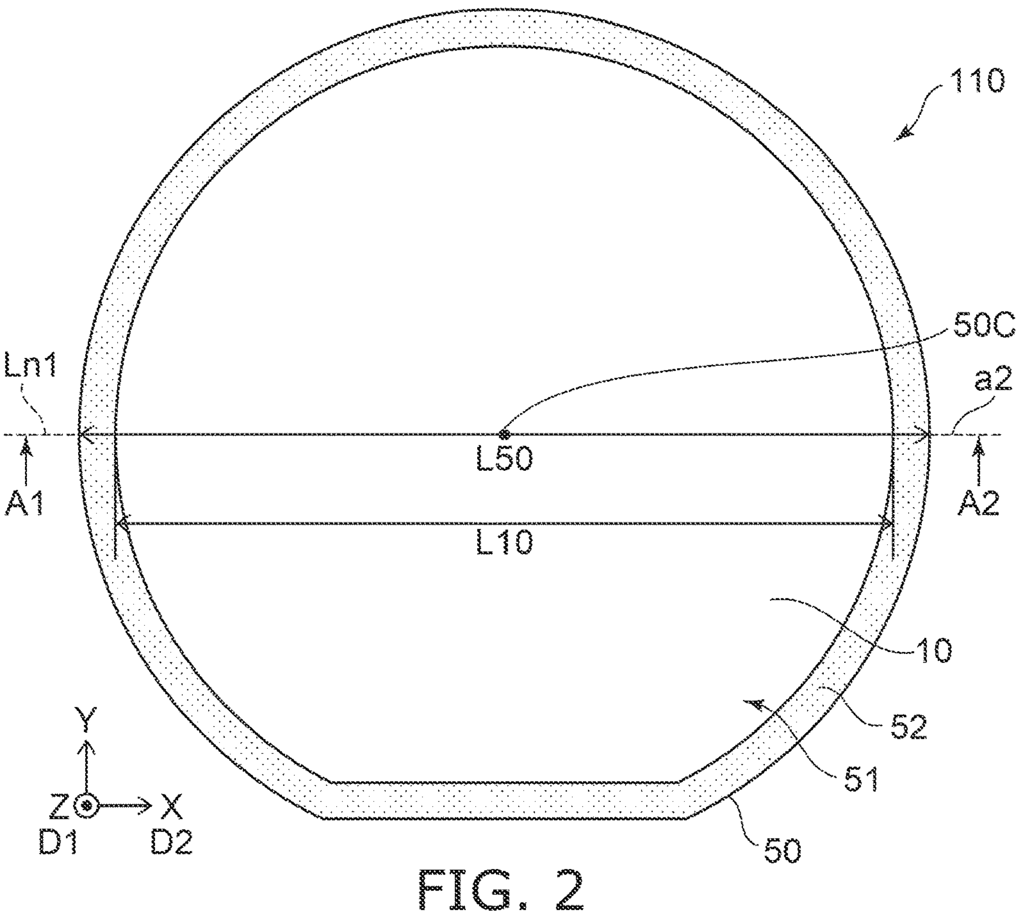
FIG. 2 is a schematic plan view illustrating the wafer according to the first embodiment.

FIG. 2 is a schematic plan view illustrating the wafer according to the first embodiment.

FIG. 1 is a cross section of the line A1-A2 of FIG. 2.

As shown in FIG. 1, a wafer 110 according to the embodiment includes a substrate 50 including SiC and a first layer 10 including SiC.

The first layer 10 contacts the substrate 50. The first layer 10 includes Cr. The substrate 50 does not include Cr. Alternatively, a concentration of Cr in the substrate 50 is lower than a concentration of Cr in the first layer 10.

A first direction D1 from the substrate 50 to the first layer 10 is defined as a Z-axis direction. One direction perpendicular to the Z-axis direction is in an X-axis direction. A direction perpendicular to the Z-axis direction and the X-axis direction is defined as a Y-axis direction. The substrate 50 and the first layer 10 extend substantially along the X-Y plane. The surface of the first layer 10 facing the substrate 50 is substantially parallel to the X-Y plane.

As shown in FIG. 2, a length of the substrate 50 along a first straight line Ln1 crossing the first direction D1 is defined as a substrate length L50. In one example, the substrate length L50 corresponds, for example, to a diameter of the substrate 50. A length of the first layer 10 along the first straight line Ln1 is defined as a first layer length L10. In one example, the first layer length L10 corresponds to a diameter of the first layer 10. In the embodiment, the substrate length L50 is longer than the first layer length L10. The first straight line Ln1 is along in a second direction D2. The second direction D2 crosses the first direction D1. The second direction D2 may be the X-axis direction, for example.

For example, as shown in FIGS. 1 and 2, the substrate 50 includes a first region 51 and a second region 52. The second region 52 is provided around the first region 51 in a plane (e.g., an X-Y plane) crossing the first direction D1. The first region 51 overlaps the first layer 10 in the first direction D1. At least a part of the second region 52 does not overlap the first layer 10 in the first direction D1. The second region 52 is, for example, a peripheral region. The second region 52 includes a bevel region. The first region 51 is, for example, a central region (for example, an element forming region).

Thus, in the wafer 110 according to the embodiment, the first layer 10 including Cr is provided inside the outer edge of the substrate 50. The first layer 10 is not provided at the outer edge of the substrate 50. Cr of the first layer 10 remains in the first layer 10 by forming the first layer 10 using, for example, a liquid including Cr.

In manufacturing a semiconductor device or the like using a SiC wafer, the outer edge of the wafer is brought into contact with a manufacturing apparatus or the like. When Cr is included in the part in contact with the manufacturing apparatus, Cr adheres to the manufacturing apparatus. Since the adhered Cr easily adheres to other wafers, etc., contamination by Cr occurs. As a result, Cr is also incorporated into the semiconductor device to be manufactured, and it is difficult to obtain the desired stable characteristics.

In embodiments, the first layer 10 including Cr is provided except for the outer edge of the substrate 50. Thereby, contamination by Cr can be suppressed when the semiconductor device or the like is manufactured using the wafer 110. According to the embodiment, a wafer capable of obtaining stable characteristics can be provided. The second region 52 is, for example, a handling region.

For example, the first layer 10 including Cr is grown by a solution method using a material including Cr. An ingot obtained by the growth is sliced to obtain the first layer 10. For example, the wafer 110 is obtained by bonding the first layer 10 and the 5 substrate 50 to each other.

As shown in FIG. 2, the substrate 50 includes a substrate center 50C in the second direction D2. In one example, the first straight line Ln1 passes through the substrate center 50C. The substrate length L50 corresponds to, for example, the length of the substrate 50 along the first straight line Ln1 passing through the substrate center 50C and being along the second direction D2. The first layer length L10 corresponds to the length of the first layer 10 along the first straight line Ln1.

For example, the substrate 50 need not be circular. The substrate 50 may include an orientation flat or the like. The substrate center 50C may be a center in any direction that crosses the first direction D1. For example, the substrate center 50C may be a center region that includes center variations caused by irregularities in the outer edges of the substrate 50.

In the embodiments, the first layer 10 includes a single crystal of SiC. In one example, the first layer 10 may include 4H-SiC. High crystal quality is obtained in the first layer 10. The threading edge dislocation density in the first layer 10 is, for example, $1000/cm^2$ or less. The threading edge dislocation density in the first layer 10 may be substantially 0.

In one example, the substrate 50 may be a sintered SiC. The substrate 50 may include polycrystals of SiC. The substrate 50 may include single crystal SiC. As described above, for example, the first layer 10 and the substrate 50 are bonded to each other. In such a case, the crystal lattice in the first layer 10 is discontinuous with the crystal lattice in the substrate 50.

As shown in FIG. 1, a thickness of the substrate 50 in the first direction D1 is defined as a substrate thickness t50. A thickness of the first layer 10 in the first direction D1 is defined as a first layer thickness t10. The substrate thickness t50 is thicker than the first layer thickness t10. The substrate 50 having a low Cr concentration functions stably as a handling region.

The first layer thickness t10 is, for example, 2 μm or less. The first layer thickness t10 may be, for example, not less than 0.5 μm and not more than 4 μm. The substrate thickness t50 may be, for example, 150 μm or more. The substrate thickness t50 may be, for example, 340 μm or more.

As shown in FIG. 1, the second region 52 may include a terrace surface 52T. The terrace surface 52T is a part of the surface of the second region 52. Thus, at least a part of the surface of the second region 52 (the terrace surface 52T) may be along the above-mentioned plane (X-Y plane).

In embodiments, the first region 51 may be a Si-rich region. For example, in the manufacture of a semiconductor device or the like using the wafer 110, the temperature of the wafer 110 becomes high. Due to this high temperature, the Cr included in the first layer 10 is easily moved to the first region 51 being Si-rich. As a result, the concentration of Cr in the first layer 10 is reduced and contamination by Cr is easily suppressed. The substrate 50 is sufficiently thick. Thus, Cr substantially does not pass through the substrate 50 in the Z-axis direction and is not discharged outside the substrate 50.

A ratio of a first Si atomic concentration in the first region 51 to a first C atomic concentration in the first region 51 is defined as a first ratio. In the embodiment, for example, the first ratio is higher than a ratio of a first layer Si atomic concentration in the first layer 10 to a first layer C atomic concentration in the first layer 10.

In one example, in the first layer 10, a ratio of Si to C is substantially 1. In one example, in the first region 51, a ratio of Si to C (first ratio) is greater than 1. The first ratio is, for example, 1.1 or more. The first ratio may be, for example, 2 or more. Cr included in the first layer 10 is easily moved efficiently to the first region 51 being Si-rich. Practically, the concentration of Si in the first region 51 may be, for example, the concentration of Si in the substrate center 50C. Practically, the concentration of C in the first region 51 may be, for example, the concentration of C in the substrate center 50C.

A ratio of a second Si atomic concentration in the second region 52 to a second C atomic concentration in the second region 52 is defined as a second ratio. In the embodiment, the first ratio may be higher than the second ratio. The second region 52 is, for example, a C-rich region. For example, the movement of Cr included in the first layer 10 to the second region 52 is suppressed. Contamination by Cr is suppressed.

A side face 10*s* of the first layer 10 may be inclined with respect to the first direction D1. The side face 10*s* may be substantially parallel to the first direction D1.

Figure 3:
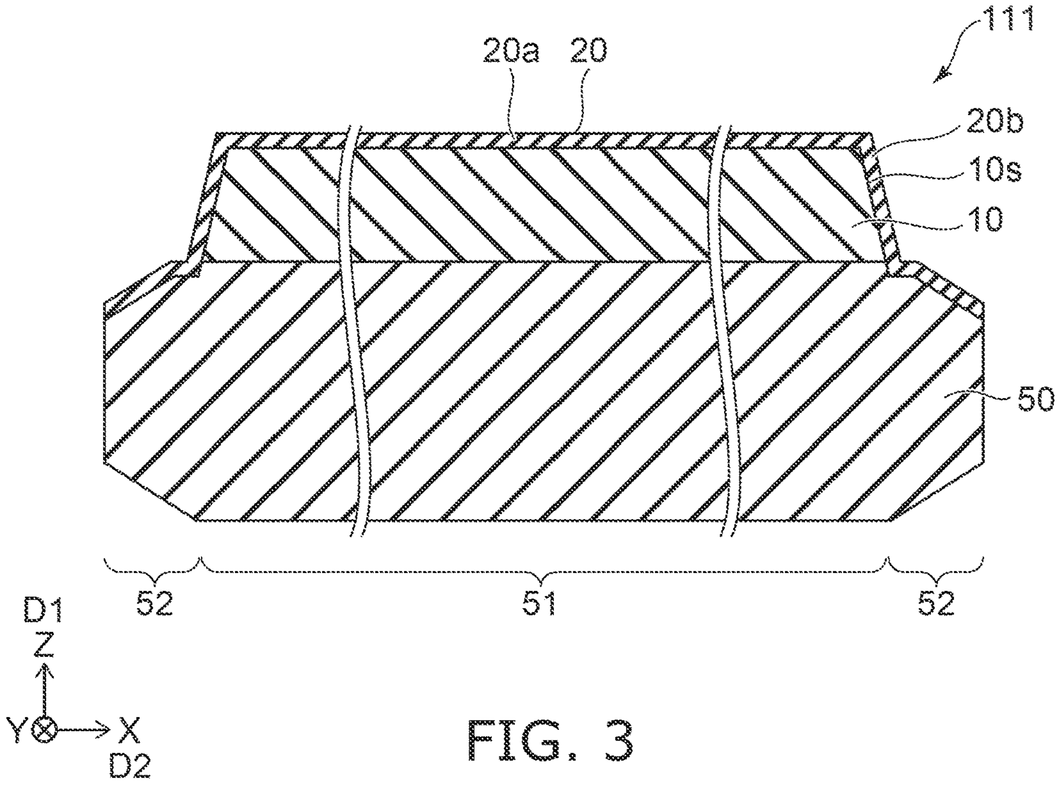
FIG. 3 is a schematic cross-sectional view illustrating a wafer according to the first embodiment.

FIG. 3 is a schematic cross-sectional view illustrating a wafer according to the first embodiment.

FIG. 3 is a cross-sectional view corresponding to the line A1-A2 of FIG. 2.

As shown in FIG. 3, a wafer 111 according to the embodiment includes a second layer 20. The configuration of the wafer 111 except for this may be the same as the configuration of the wafer 110.

The second layer 20 includes SiC. At least a part of the second layer 20 includes, for example, a single crystal of SiC. The first layer 10 is provided between the substrate 50 and at least a part of the second layer 20 in the first direction D1. The second layer 20 does not include Cr. Alternatively, a concentration of Cr in the second layer 20 is lower than the concentration of Cr in the first layer 10. For example, the second layer 20 is epitaxially grown on the first layer 10.

A second layer 20 having a low concentration of Cr is provided on the first layer 10. Thereby, contamination by Cr is more effectively suppressed.

As shown in FIG. 3, the second layer 20 may cover the side face 10*s* of the first layer 10. The side face 10*s* of the first layer 10 crosses the second direction D2. The second layer 20 may also be provided on the second region 52 of the substrate 50.

As shown in FIG. 3, for example, the second layer 20 includes a first partial region 20*a* and a second partial region 20*b*. The first layer 10 is provided between the substrate 50 and the first partial region 20*a* in the first direction D1. The first layer 10 is provided between a part of the second partial region 20*b* and another part of the second partial region 20*b* in the plane (X-Y plane) crossing the first direction D1. The second partial region 20*b* faces the side face 10*s* of the first layer 10.

The first partial region 20*a* may include a single crystal of SiC. At least a part of the second partial region 20*b* may include at least one of an amorphous crystal or a polycrystal.

The second layer 20 may be formed by, for example, CVD (Chemical Vapor Deposition). In one example where CVD is used, for example, a temperature of not less than 1,500° C. and not more than 1,700° C. may be used. For example, the first partial region 20*a* may be formed by CVD and the second partial region 20*b* may be formed by PVD.

Figure 4:
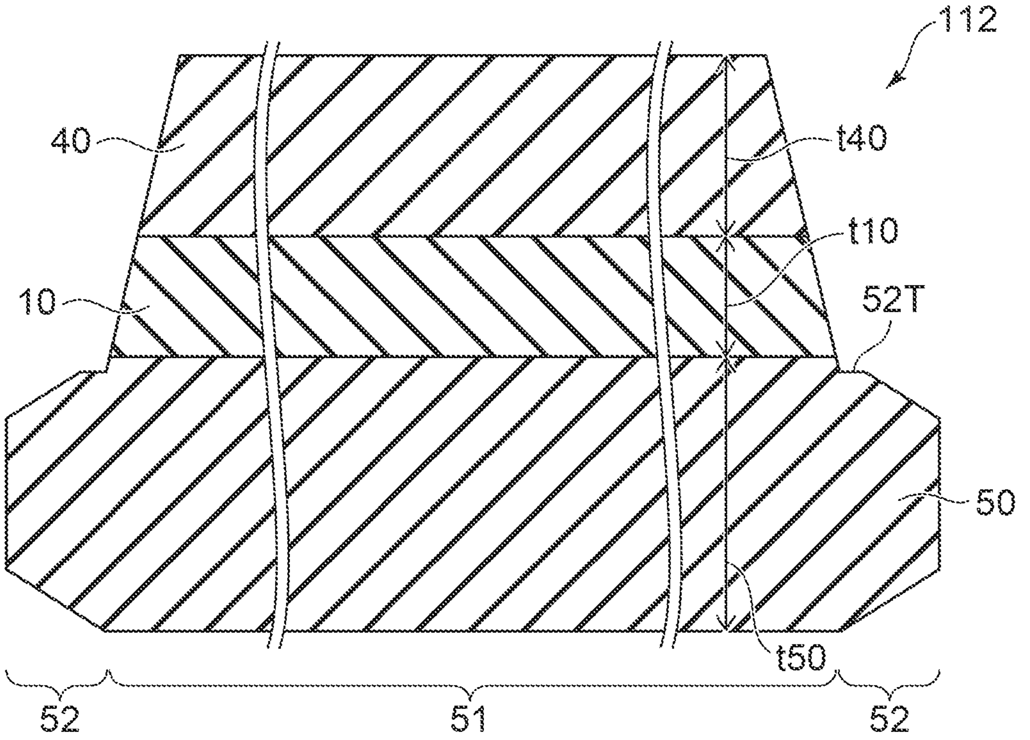
FIG. 4 is a schematic cross-sectional view illustrating a wafer according to the first embodiment.
Figure 4:
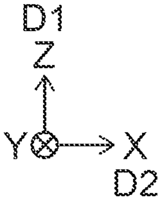

FIG. 4 is a schematic cross-sectional view illustrating a wafer according to the first embodiment.

As shown in FIG. 4, a wafer 112 according to the embodiment includes a fourth layer 40. The configuration of the wafer 112 except for this may be the same as the configuration of the wafer 110.

For example, at least a part of the first layer 10 is provided between the substrate 50 and the fourth layer 40. The fourth layer 40 includes SiC. At least a part of the fourth layer 40 includes, for example, a single crystal of SiC. The fourth layer 40 does not include Cr. Alternatively, a concentration of Cr in the fourth layer 40 is lower than the concentration of Cr in the first layer 10. For example, the fourth layer 40 is epitaxially grown on the first layer 10. The fourth layer 40 having a low concentration of Cr is provided on the first layer 10. Thereby, contamination by Cr is more effectively suppressed.

A fourth layer thickness t40 of the fourth layer 40 along the first direction D1 is, for example, not less than 2 μm and not more than 20 μm. In a case where the fourth layer 40 being thick is provided, the first layer thickness t10 may be, for example, not less than 50 μm and not more than 100 μm. The fourth layer 40 suppresses the movement (for example, diffusion) of Cr.

Figure 5:
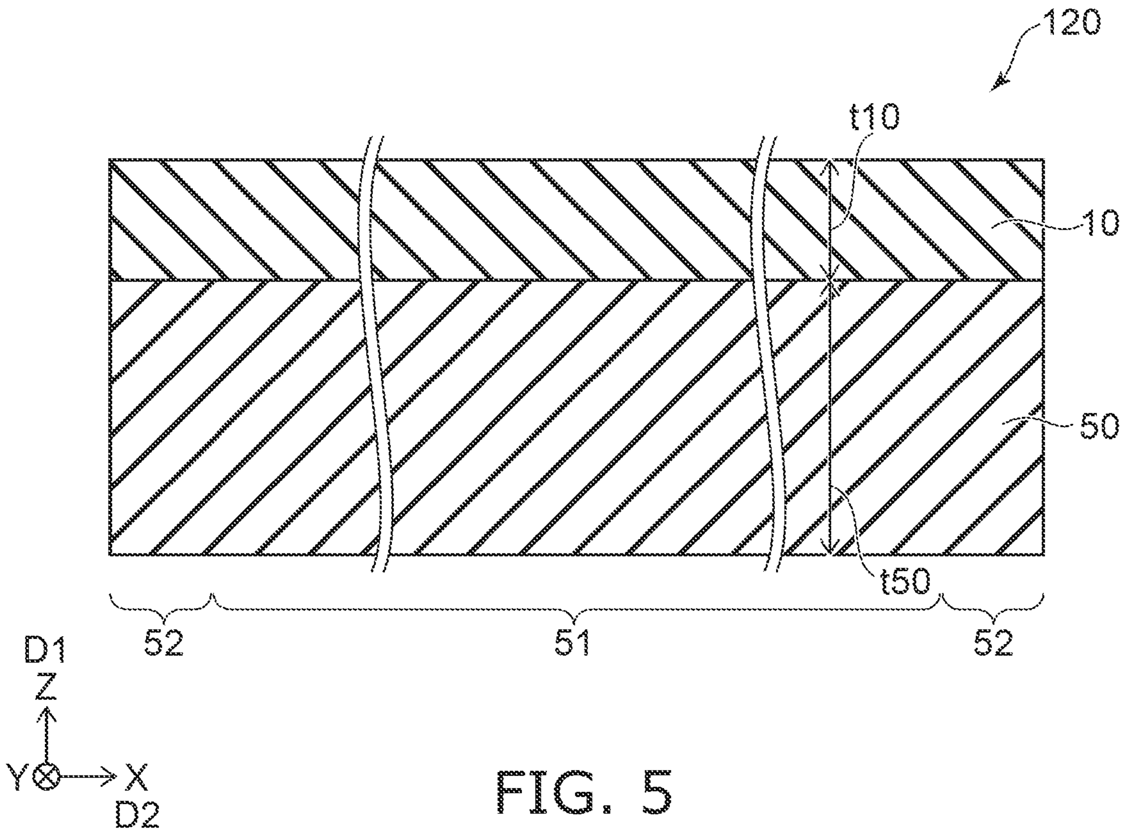
FIG. 5 is a schematic cross-sectional view illustrating a wafer according to the first embodiment.

FIG. 5 is a schematic cross-sectional view illustrating a wafer according to the first embodiment.

As shown in FIG. 5, a wafer 120 according to the embodiment includes the substrate 50 including SiC and the first layer 10 including SiC. The first layer 10 contacts the substrate 50. The first layer 10 includes Cr.

In the wafer 120, the substrate 50 includes the first region 51 and the second region 52. The second region 52 is provided around the first region 51 in the plane (X-Y plane) crossing a first direction D1 from the substrate 50 to the first layer 10. The first ratio of the first Si atomic concentration in the first region 51 to the first C atomic concentration in the first region 51 is higher than the ratio of the first layer Si atomic concentration in the first layer 10 to the first layer C atomic concentration in the first layer 10.

In the wafer 120, the first ratio may be higher than the second ratio. The second ratio is the ratio of the second Si atomic concentration in the second region 52 to the second C atomic concentration in the second region 52. Practically, the concentration of C in the first region 51 may be, for example, the concentration of C in the substrate center 50C.

For example, when heat treatment is performed, Cr included in the first layer 10 moves to the first region 51, and the concentration of Cr in the first layer 10 decreases. Contamination by Cr can be suppressed.

For example, the first region 51 overlaps the first layer 10 in the first direction D1. For example, at least a part of the second region 52 may not overlap the first layer 10 in the first direction D1. For example, the wafer 120 may be processed to make a bevel to obtain the wafer 110.

Second Embodiment

Figure 6:
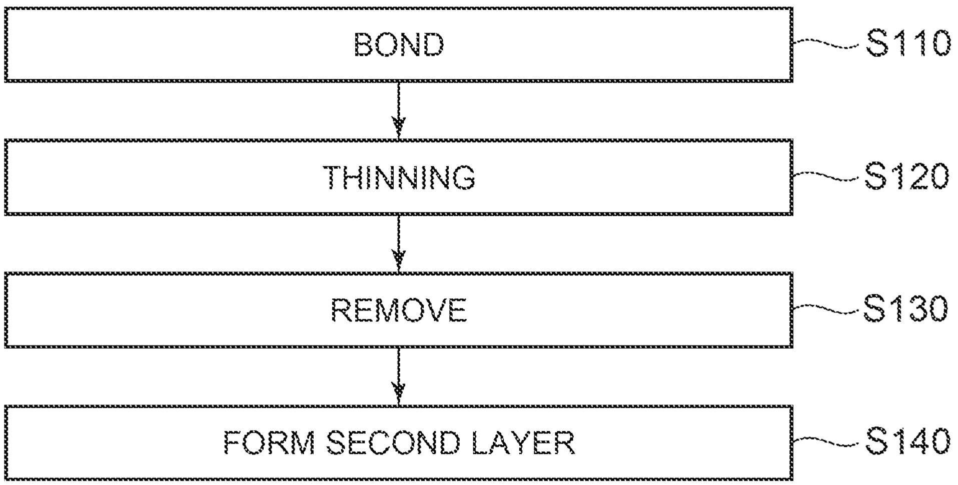
FIG. 6 is a flowchart illustrating a method for manufacturing a wafer according to a second embodiment.

FIG. 6 is a flowchart illustrating a method for manufacturing a wafer according to a second embodiment.

Figure 7:
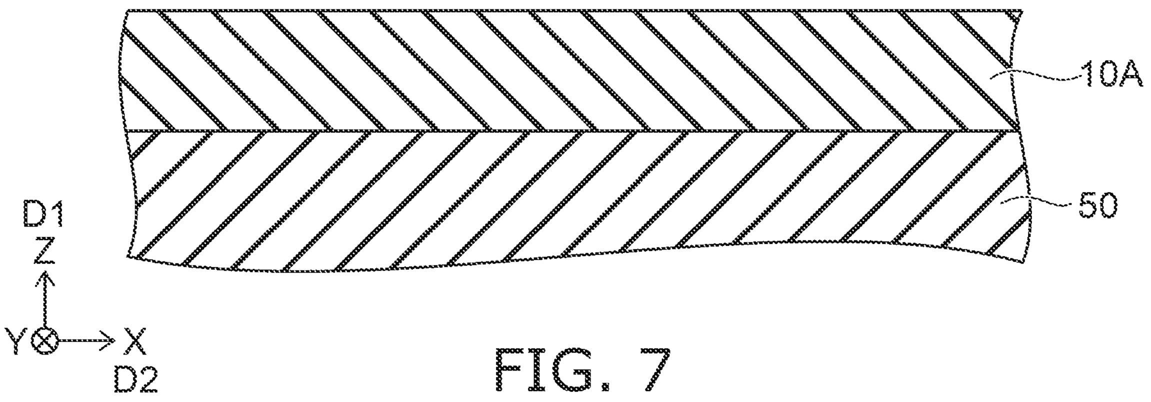
FIG. 7 is a schematic sectional view illustrating the method for manufacturing the wafer according to the second embodiment.
Figure 8:
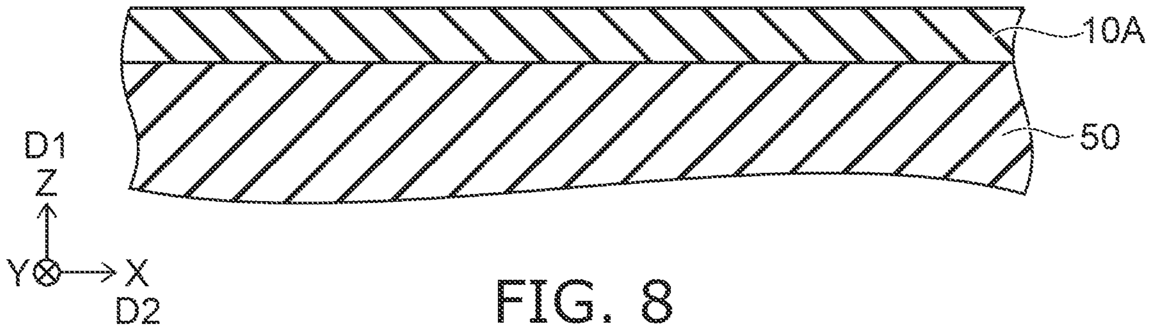
FIG. 8 is a schematic sectional view illustrating the method for manufacturing the wafer according to the second embodiment.
Figure 9:
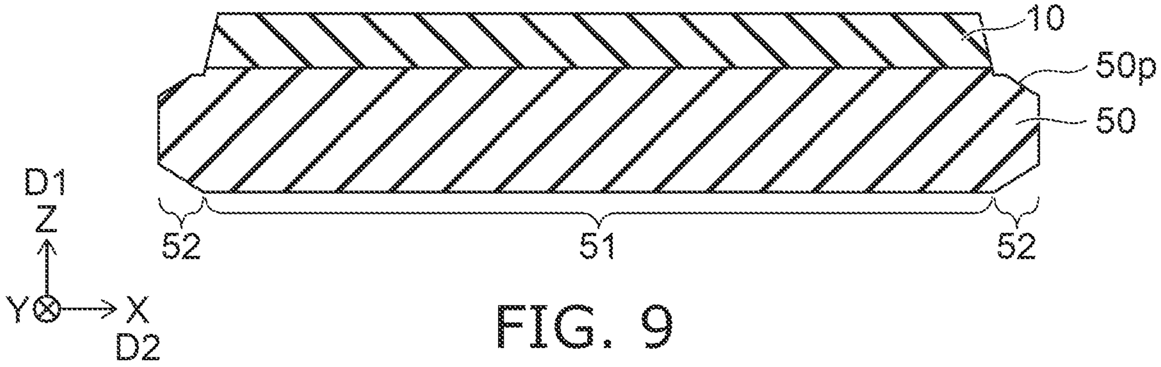
FIG. 9 is a schematic sectional view illustrating the method for manufacturing the wafer according to the second embodiment.

FIGS. 7 to 9 are schematic sectional views illustrating the method for manufacturing the wafer according to the second embodiment.

As shown in FIG. 6, bonding is performed in the method for manufacturing the wafer according to the embodiment (step S110).

For example, as shown in FIG. 7, a structure 10A including SiC is bonded to the substrate 50 including SiC. The structure 10A includes Cr. The substrate 50 does not include Cr. Alternatively, the concentration of Cr in the substrate 50 is lower than that in the structure 10A.

As shown in FIG. 6, after the step S110, a part of the structure 10A is removed (step S130). As shown in FIG. 6, step S120 may be performed between the step S110 and the step S130.

As shown in FIG. 8, in the step S120, a part of the structure 10A is removed to thin the structure 10A. Before the thinning, the thickness of the substrate 50 and the thickness of the structure 10A may be 150 μm or more. Stable bonding (and handling) can be performed. The thickness of the first layer 10 obtained after the thinning may be, for example, 100 μm or less. In one example, the thickness of the first layer 10 obtained after the thinning may be, for example, not less than 50 μm and not more than 100 μm. In this case, the expansion of dislocations to the first layer 10 is easily suppressed. In another example, the thickness of the first layer 10 obtained after the thinning may be, for example, not less than 0.5 μm and not more than to 4 μm. In this case, the concentration of Cr in the substrate 50 caused by migration from the first layer 10 can easily be maintained low. In addition, the concentration of Cr in the first layer 10 can be lowered. The thickness of the first layer 10 may be, for example, 2 μm or less.

As shown in FIG. 9, in the step S130, at least a part of the outer edge of the structure 10A is removed to form the first layer 10 from the structure 10A. By this process, a part 50*p* of the substrate 50 is exposed. The part 50*p* being exposed corresponds to at least a part of the second region 52.

By removing at least a part of the outer edge of the structure 10A, the first layer 10 having a high concentration of Cr can be separated from the outer edge of the substrate 50. The wafer 110 capable of suppressing contamination by Cr can be efficiently obtained.

As described above, a part of the structure 10A may be removed to thin the structure 10A after the bonding (step S110) and prior to the removing process (step S130). Thus, the volume of the region including Cr can be reduced. Contamination by Cr can be more suppressed.

As shown in FIG. 6, in the manufacturing method according to the embodiment, the second layer 20 including SiC may be further formed (step S140). The first layer 10 is provided between the substrate 50 and the second layer 20. For example, the second layer 20 is formed on the first layer 10 and on the exposed portion included in the substrate 50. On the first layer 10, the second layer 20 may be epitaxially grown.

Figure 10:
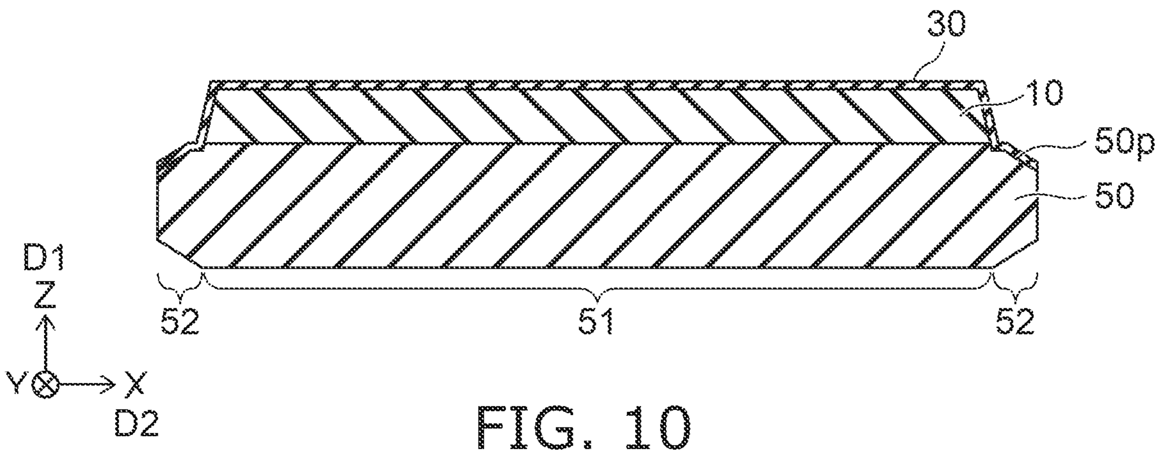
FIG. 10 is a schematic cross-sectional view illustrating a method for manufacturing the wafer according to the second embodiment.

FIG. 10 is a schematic cross-sectional view illustrating a method for manufacturing the wafer according to the second embodiment.

As shown in FIG. 10, a third layer 30 may be formed on the first layer 10 after the step S130. The third layer 30 may be, for example, a Si layer or a silicon oxide layer. Heat treatment may be performed after the third layer 30 is formed. By the heat treatment, Cr included in the first layer 10 is transferred to the third layer 30, and the concentration of Cr in the first layer 10 can be reduced. After the forming the third layer 30 and the heat treatment, the third layer 30 may be removed and the first layer 10 may be exposed. The second layer 20 including SiC may be formed on the first layer 10 being exposed. The second layer 20 is epitaxially grown, for example.

When the third layer is a Si layer, the conditions for forming the third layer 30 may be, for example, 650° C. or less. When the third layer 30 includes silicon oxide, the conditions for forming the third layer 30 may be, for example, 650° C. or less. Various methods such as CVD or PVD may be applied.

Hereinafter, an example of a method for manufacturing a substrate 50 including the first region 51 being Si-rich will be described.

Figure 11:
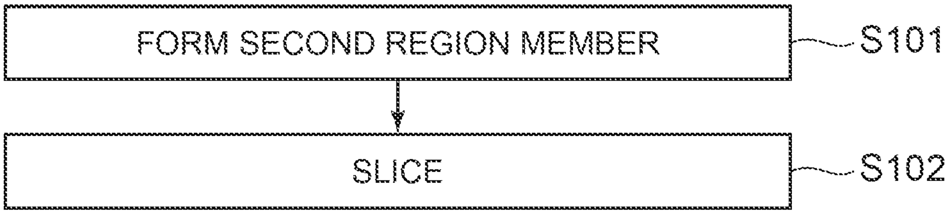
FIG. 11 is a flowchart illustrating a method for manufacturing the wafer according to the second embodiment.

FIG. 11 is a flowchart illustrating a method for manufacturing the wafer according to the second embodiment.

FIGS. 12 to 15 are schematic perspective views illustrating the method for manufacturing the wafer according to the second embodiment.

Figure 12:
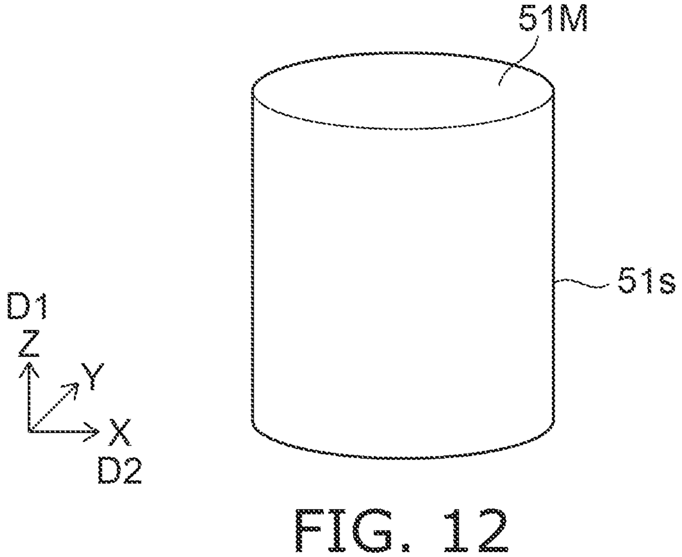
FIG. 12 is a schematic perspective view illustrating the method for manufacturing the wafer according to the second embodiment.

As shown in FIG. 12, a first region member 51M including SiC is prepared. The first region member 51M may be, for example, columnar (cylindrical, etc). The first region member 51M includes a first region side face 51*s*.

Figure 13:
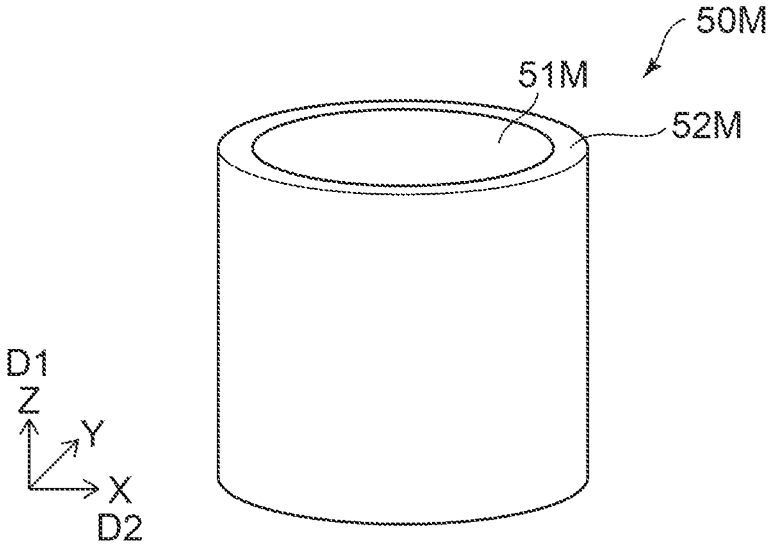
FIG. 13 is a schematic perspective view illustrating the method for manufacturing the wafer according to the second embodiment.

As shown in FIG. 13, a second region member 52M including SiC is formed around the first region member 51M including SiC. The forming the second region member 52M may be performed, for example, by chemical vapor deposition. The second region member 52M is formed on at least the first region side face 51*s*.

The first ratio of the first Si atomic concentration in the first region member 51M to the first C atomic concentration in the first region member 51M is higher than the second ratio of the second Si atomic concentration in the second region member 52M to the second C atomic concentration in the second region member 52M. For example, the first region member 51M is a Si-rich region. By the first region member 51M and the second region member 52M, the substrate member 50M is obtained.

Figure 14:
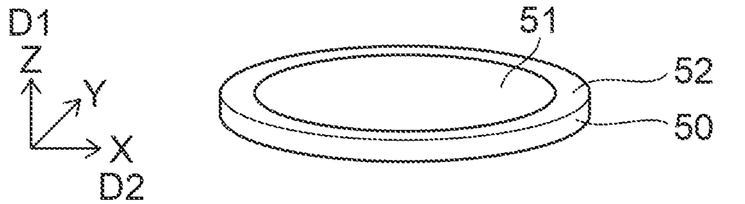
FIG. 14 is a schematic perspective view illustrating the method for manufacturing the wafer according to the second embodiment.

As shown in FIG. 14, the substrate 50 is obtained by slicing the substrate member 50M including the first region member 51M and the second region member 52M. If necessary, processing such as flattening may be performed. Further, in this processing, processing to make the end portion of the second region member 52M curved may be performed.

In this manner, the second region member 52M including SiC is formed around the first region member 51M including SiC (step S101 in FIG. 11) to form the substrate 50 (step S102). For example, the forming the substrate 50 includes slicing the substrate member 50M including the first region member 51M and the second region member 52M.

Figure 15:
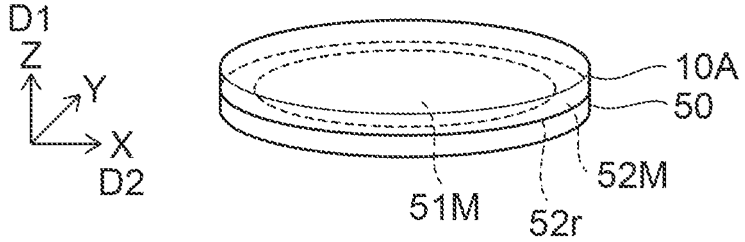
FIG. 15 is a schematic perspective view illustrating the method for manufacturing the wafer according to the second embodiment.

As shown in FIG. 15, the substrate 50 thus obtained is bonded to the structure 10A including SiC (step S110 of FIG. 6).

Thereafter, the step S130 of FIG. 6 is performed. As previously described, the step S120 may be performed prior to the step S130.

As shown in FIG. 15, the second region member 52M includes an facing region 52*r* facing the structure 10A. In the step S130, at least a part of the outer edge of the structure 10A is removed. Thus, the first layer 10 is formed from the structure 10A. By this processing, at least a part of the facing region 52*r* is exposed or the main part of the facing region 52*r* is removed except the interface region between the edge region of the structure 10A and the substrate 50.

The embodiments may include the following Technical proposals:

(Technical Proposal 1)

A wafer, comprising:
a substrate including SiC; and
a first layer including SiC,
the first layer being in contact with the substrate,
the first layer including Cr,
the substrate not including Cr, or a concentration of Cr in the substrate being lower than a concentration of Cr in the first layer,
a substrate length of the substrate in a second direction crossing a first direction from the substrate to the first layer being longer than a first layer length of the first layer in the second direction.

(Technical Proposal 2)

The wafer according to Technical proposal 1, wherein
the substrate includes a first region and a second region,
the second region is provided around the first region in a plane crossing the first direction,
the first region overlaps the first layer in the first direction, and
at least a part of the second region does not overlap the first layer in the first direction.

(Technical Proposal 3)

The wafer according to Technical proposal 2, wherein
the first layer includes a single crystal of SiC.

(Technical Proposal 4)

The wafer according to Technical proposal 2 or 3, wherein
a crystal lattice in the first layer is discontinuous with a crystal lattice in the substrate.

(Technical Proposal 5)

The wafer according to any one of Technical proposals 2-4, wherein
a substrate thickness of the substrate in the first direction is thicker than a first layer thickness of the first layer in the first direction.

(Technical Proposal 6)

The wafer according to Technical proposal 5, wherein the first layer thickness is 2 μm or less.

(Technical Proposal 7)

The wafer according to any one of Technical proposals 2-6, further comprising:
a second layer including SiC,
the first layer being provided between the substrate and at least a part of the second layer in the first direction, and
the second layer not including Cr or a concentration of Cr in the second layer being lower than the concentration of Cr in the first layer.

(Technical Proposal 8)

The wafer according to Technical proposal 7, wherein
the second layer covers a side face of the first layer.

(Technical Proposal 9)

The wafer according to Technical proposal 7 or 8, wherein
at least a part of the second layer includes a single crystal of SiC.

(Technical Proposal 10)

The wafer according to any one of the Technical proposals 1-4, further comprising:

a fourth layer including SiC, at least a part of the first layer being provided between the substrate and the fourth layer, the fourth layer not including Cr, or a concentration of Cr in the fourth layer being lower than the concentration of Cr in the first layer, and a thickness of the fourth layer in the first direction of the fourth layer being not less than 2 μm and not more than 20 μm.

(Technical Proposal 11)

The wafer according to any one of Technical proposals 2-6, wherein a first ratio of a first Si atomic concentration in the first region to a first C atomic concentration in the first region is higher than a ratio of the first layer Si atomic concentration in the first layer to a first layer C atomic concentration in the first layer.

(Technical Proposal 12)

The wafer according to any one of Technical proposals 2-6, wherein a first ratio of a first Si atomic concentration in the first region to a first C atomic concentration in the first region is higher than a second ratio of a second Si atomic concentration in the second region to a second C atomic concentration in the second region.

(Technical Proposal 13)

The wafer according to any one of Technical proposals 2-6, wherein at least a part of a surface of the second region is along the plane.

(Technical Proposal 14)

A wafer, comprising:

a substrate including SiC; and a first layer including SiC, the first layer being in contact with the substrate, the first layer including Cr, the substrate including a first region and a second region, the second region being provided around the first region in a plane crossing a first direction from the substrate to the first layer, and a first ratio of a first Si atomic concentration in the first region to a first C atomic concentration in the first region being higher than a ratio of the first layer Si atomic concentration in the first layer to a first layer C atomic concentration in the first layer.

(Technical Proposal 15)

A method for manufacturing a wafer, comprising:

bonding a structure including SiC to a substrate including SiC, the structure including Cr and the substrate not including Cr, or a concentration of Cr in the substrate being lower than a concentration of Cr in the structure; and performing a processing to remove at least a part of an outer edge of the structure to form a first layer from the structure and to expose a part of the substrate.

(Technical Proposal 16)

The method for manufacturing the wafer according to Technical proposal 15, wherein after the bonding and before the processing, a part of the structure is removed to make the structure thin.

(Technical Proposal 17)

A method for manufacturing a wafer, comprising:

forming a second region member including SiC around a first region member including SiC to form a substrate, a first ratio of a first Si atomic concentration in the first region member to a first C atomic concentration in the first region member being higher than a second ratio of a second Si atomic concentration in the second region member to a second C atomic concentration in the second region member, bonding the substrate and a structure including SiC, the second region member including a facing region facing the structure; and performing a processing to remove at least a part of an outer edge of the structure to form a first layer from the structure and to expose a part of the substrate.

(Technical Proposal 18)

The method for manufacturing the wafer according to Technical proposal 17, wherein the forming the substrate includes slicing a substrate member including the first region member and the second region member.

(Technical Proposal 19)

The method for manufacturing the wafer according to Technical proposal 17 or 18, wherein the forming the second region member is performed by a chemical vapor deposition.

(Technical Proposal 20)

The method for manufacturing the wafer according to any one of Technical proposals 15-19, further comprising:

forming a second layer including SiC, the first layer being provided between the substrate and the second layer.

According to the embodiment, it is possible to provide a wafer and a method for manufacturing the same that can obtain stable characteristics.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the wafers such as substrates, layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all wafers and all methods for manufacturing the same practicable by an appropriate design modification by one skilled in the art based on the wafers and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A wafer, comprising:
a substrate including SiC; and
a first layer including SiC,
the first layer being in contact with the substrate,
the first layer including Cr,
the substrate not including Cr, or a concentration of Cr in the substrate being lower than a concentration of Cr in the first layer,
a substrate length of the substrate in a second direction crossing a first direction from the substrate to the first layer being longer than a first layer length of the first layer in the second direction,
wherein
the substrate includes a first region and a second region,
the second region is provided around the first region in a plane crossing the first direction,
the first region overlaps the first layer in the first direction,
at least a part of the second region does not overlap the first layer in the first direction, and
a first ratio of a first Si atomic concentration in the first region to a first C atomic concentration in the first region is higher than a second ratio of a second Si atomic concentration in the second region to a second C atomic concentration in the second region.

2. The wafer according to claim 1, wherein
the first layer includes a single crystal of SiC.

3. The wafer according to claim 1, wherein
a crystal lattice in the first layer is discontinuous with a crystal lattice in the substrate.

4. The wafer according to claim 1, wherein
a substrate thickness of the substrate in the first direction is thicker than a first layer thickness of the first layer in the first direction.

5. The wafer according to claim 4, wherein the first layer thickness is 2 μm or less.

6. The wafer according to claim 1, further comprising:
a second layer including SiC,
the first layer being provided between the substrate and at least a part of the second layer in the first direction, and
the second layer not including Cr or a concentration of Cr in the second layer being lower than the concentration of Cr in the first layer.

7. The wafer according to claim 6, wherein
the second layer covers a side face of the first layer.

8. The wafer according to claim 6, wherein
at least a part of the second layer includes a single crystal of SiC.

9. The wafer according to claim 1, further comprising:
a fourth layer including SiC,
at least a part of the first layer being provided between the substrate and the fourth layer,
the fourth layer not including Cr, or a concentration of Cr in the fourth layer being lower than the concentration of Cr in the first layer, and
a thickness of the fourth layer in the first direction of the fourth layer being not less than 2 μm and not more than 20 μm.

10. The wafer according to claim 1, wherein
a first ratio of a first Si atomic concentration in the first region to a first C atomic concentration in the first region is higher than a ratio of the first layer Si atomic concentration in the first layer to a first layer C atomic concentration in the first layer.

11. The wafer according to claim 1, wherein
at least a part of a surface of the second region is along the plane.

12. A method for manufacturing a wafer, comprising:
forming a second region member including SiC around a first region member including SiC to form a substrate, a first ratio of a first Si atomic concentration in the first region member to a first C atomic concentration in the first region member being higher than a second ratio of a second Si atomic concentration in the second region member to a second C atomic concentration in the second region member,
bonding the substrate and a structure including SiC, the second region member including a facing region facing the structure; and
performing a processing to remove at least a part of an outer edge of the structure to form a first layer from the structure and to expose a part of the substrate.

13. The method for manufacturing the wafer according to claim 12, wherein
the forming the substrate includes slicing a substrate member including the first region member and the second region member.

14. The method for manufacturing the wafer according to claim 12, wherein
the forming the second region member is performed by a chemical vapor deposition.

15. The method for manufacturing the wafer according to claim 12, further comprising:
forming a second layer including SiC,
the first layer being provided between the substrate and the second layer.

* * * * *